(12) United States Patent
Delano et al.

(10) Patent No.: US 10,248,172 B2
(45) Date of Patent: *Apr. 2, 2019

(54) SPECTRALLY SELECTIVE RADIATION EMISSION DEVICE

(71) Applicant: Microsoft Technology Licensing, LLC, Redmond, WA (US)

(72) Inventors: Andrew Douglas Delano, Woodinville, WA (US); Timothy Allen Jakoboski, Woodinville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/144,363

(22) Filed: May 2, 2016

(65) Prior Publication Data

US 2016/0246339 A1    Aug. 25, 2016

Related U.S. Application Data

(63) Continuation of application No. 14/280,954, filed on May 19, 2014, now Pat. No. 9,329,647.

(51) Int. Cl.
*G06F 1/20* (2006.01)
*G21K 5/02* (2006.01)
(Continued)

(52) U.S. Cl.
CPC ............ *G06F 1/203* (2013.01); *G06F 1/1637* (2013.01); *G06F 1/26* (2013.01); *G21K 5/02* (2013.01); *H05K 7/20427* (2013.01)

(58) Field of Classification Search
CPC ....... H05K 7/20472–7/20481; H05K 7/20427; H05K 2201/0707; H05K 2201/10371;
(Continued)

(56) References Cited

U.S. PATENT DOCUMENTS

| 6,521,038 B2 | 2/2003 | Yanagimoto et al. |
| 8,531,308 B2 | 9/2013 | Dickie et al. |

(Continued)

FOREIGN PATENT DOCUMENTS

| CN | 101188924 A | 5/2008 |
| CN | 101969753 A | 2/2011 |

(Continued)

OTHER PUBLICATIONS

"International Preliminary Report on Patentability Issued in PCT Application No. PCT/US2015/031269", dated Aug. 4, 2016, 6 Pages.

(Continued)

*Primary Examiner* — Steven T Sawyer
*Assistant Examiner* — Sagar Shrestha
(74) *Attorney, Agent, or Firm* — Ray Quinney & Nebeker P.C.; Paul N. Taylor (57) ABSTRACT

A spectrally selective radiation emission device is described. In one or more implementations, an apparatus includes a housing, one or more electrical components disposed within the housing, and a spectrally selective radiation emission device. The one or more electrical components are configured to generate heat during operation. The spectrally selective radiation emission device is disposed on the housing and configured to emit radiation when heated by the one or more electrical components at one or more wavelengths of electromagnetic energy and reflect radiation at one or more other wavelengths of electromagnetic energy.

20 Claims, 7 Drawing Sheets

(51) Int. Cl.
*H05K 7/20* (2006.01)
*G06F 1/16* (2006.01)
*G06F 1/26* (2006.01)

(58) Field of Classification Search
CPC .. H05K 9/0081; H05K 9/0098; H05K 9/0024; H05K 9/0052; H05K 7/2039; G06F 1/20–1/203; F28F 13/18
USPC ...... 361/679.46–679.54, 688–723, 800, 816, 361/818
See application file for complete search history.

(56) References Cited

U.S. PATENT DOCUMENTS

| | | | |
|---|---|---|---|
| 8,601,757 B2 | 12/2013 | Jaster et al. | |
| 8,828,519 B2 | 9/2014 | Wen et al. | |
| 9,329,647 B2 | 5/2016 | Delano et al. | |
| 2005/0242301 A1 | 11/2005 | Pierce | |
| 2006/0086494 A1* | 4/2006 | Kim | B41J 2/471 165/185 |
| 2008/0117599 A1* | 5/2008 | Endo | H05K 7/20427 361/705 |
| 2008/0317423 A1* | 12/2008 | Stepanov | G02B 6/122 385/132 |
| 2010/0008044 A1 | 1/2010 | Ogiro et al. | |
| 2010/0017922 A1* | 1/2010 | Shin | B82Y 20/00 850/21 |
| 2010/0085453 A1* | 4/2010 | Oh | H04N 9/045 348/294 |
| 2011/0042052 A1 | 2/2011 | Smith et al. | |
| 2011/0122071 A1* | 5/2011 | Powell | G06F 3/0412 345/173 |
| 2012/0075992 A1 | 3/2012 | Shahidi et al. | |
| 2012/0162751 A1* | 6/2012 | Liang | G02B 1/10 359/359 |
| 2012/0314280 A1* | 12/2012 | Luttmann | G02B 5/208 359/356 |
| 2013/0072617 A1* | 3/2013 | Agari | C09D 7/1216 524/424 |
| 2013/0235559 A1 | 9/2013 | Bergquist | |
| 2014/0060604 A1 | 3/2014 | Boriskina et al. | |
| 2014/0182679 A1 | 7/2014 | Rosenberg et al. | |
| 2014/0272217 A1* | 9/2014 | Weber | H05K 13/00 428/34.6 |
| 2014/0314118 A1* | 10/2014 | LaVeigne | G01J 5/522 374/2 |
| 2015/0014047 A1* | 1/2015 | Hutchison | H05K 9/009 174/350 |
| 2015/0331461 A1 | 11/2015 | Delano et al. | |

FOREIGN PATENT DOCUMENTS

| | | |
|---|---|---|
| CN | 102555314 A | 7/2012 |
| CN | 202310429 U | 7/2012 |
| CN | 202857206 U | 4/2013 |
| CN | 103209574 A | 7/2013 |
| EP | 2554935 A1 | 2/2013 |
| JP | 2005144985 A | 6/2005 |
| RU | 37575 U1 | 4/2004 |
| WO | WO-2009142036 | 11/2009 |
| WO | WO-2013166521 | 11/2013 |

OTHER PUBLICATIONS

"Second Written Opinion", Application No. PCT/US2015/031269, dated May 10, 2016, 5 pages.
"Notice of Allowance", U.S. Appl. No. 14/280,954, dated Jan. 13, 2016, 16 pages.
"International Search Report and Written Opinion", Application No. PCT/US2015/031269, dated Sep. 17, 2015, 9 Pages.
"Selecting Windows for Energy Efficiency", Available at: <http://windows.lbl.gov/pub/selectingwindows/window.pdf>, U.S. Department of Energy, Oct. 2, 2003, 16 Pages.
Manara,"Polymer-Based Pigmented Coatings on Flexible Substrates with Spectrally Selective Characteristics to Improve the Thermal Properties", Progress in Organic Coatings 70 (2011), 2011, pp. 199-204.
Roro,"Effect of Accelerated Thermal Ageing on the Selective Solar Thermal Harvesting Properties of Multiwall Carbon Nanotube/Nickel Oxide Nanocomposite Coatings", In Proceedings: International Journal of Photoenergy, vol. 2012, Mar. 27, 2012, 8 pages.
"Office Action Issued in Mexican Patent Application No. MX/a/2016/015070", dated Jun. 28, 2018, 5 Pages.
"Office Action Issued in Chinese Patent Application No. 201580025555.4", dated Nov. 30, 2018, 17 Pages.
"Office Action Issued in Russian Patent Application No. 2016145069", dated Dec. 17, 2018, 19 Pages.

* cited by examiner

802
Secure a spectrally selective radiation emission device to a housing of a computing device that is configured to be held by one or more hands of a user

↓

804
Position one or more computing device components within the housing that are configured to generate heat, during operation, at an approximate operating temperature, thereby causing the spectrally selective radiation emission device to emit radiation at one or more wavelengths of electromagnetic energy thereby cooling the housing and reflect radiation at one or more other wavelengths of electromagnetic energy

SPECTRALLY SELECTIVE RADIATION EMISSION DEVICE

PRIORITY

This application is a continuation and claims priority to U.S. patent application Ser. No. 14/280,954 entitled "Computing Device Having a Spectrally Selective Radiation Emission Device" and filed May 19, 2014, the disclosure of which is incorporated by reference herein in its entirety.

BACKGROUND

Mobile computing devices such as tablets and mobile phones are typically configured in a form factor that is designed to be held by one or more hands of a user. As heat may develop during operation, these devices are also designed to remain at or below a safe temperature limits during operation such that the devices do not burn the user nor harm the internal components of the device.

For example, once a device reaches a safe temperature limit, power consumption by the device may be reduced to also reduce the amount of heat generated by the device. However, this may also have an adverse effect on device performance, e.g., reduced computational functionality that is made available to a user. Thus, safe temperature limits defined due to the handheld nature of the computing device, as well as safe temperature limits for other devices that are not hand held (such as to protect internal components of the device), may have an impact on functionality of the device that is made available to a user.

SUMMARY

A spectrally selective radiation emission device is described. In one or more implementations, an apparatus includes a housing, one or more electrical components disposed within the housing, and a spectrally selective radiation emission device. The one or more electrical components are configured to generate heat during operation. The spectrally selective radiation emission device is disposed on the housing and configured to emit radiation, when heated by the one or more electrical components, at one or more wavelengths of electromagnetic energy and reflect radiation at one or more other wavelengths of electromagnetic energy.

In one or more implementations, a computing device includes a housing configured according to a hand-held form factor that is suitable to be held by one or more hands of a user, one or more computing device components disposed within the housing, and a spectrally selective radiation emission device. The one or more computing device components are configured to generate heat at an approximate operating temperature to perform one or more computing device operations. The spectrally selective radiation emission device is disposed on the housing and configured to emit radiation when at the approximate operating temperature at one or more wavelengths of electromagnetic energy thereby cooling the one or more computing device components.

In one or more implementations, a spectrally selective radiation emission device is secured to a housing of a computing device that is configured to be held by one or more hands of a user. One or more computing device components are positioned within the housing that are configured to generate heat, during operation, at an approximate operating temperature, thereby causing the spectrally selective radiation emission device to emit radiation at one or more wavelengths of electromagnetic energy and thereby cooling the housing and reflecting radiation at one or more other wavelengths of electromagnetic energy.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

DETAILED DESCRIPTION

Overview

Temperature limits may be employed by devices, such as mobile computing devices, to protect users of the devices from harm, protect internal components of the devices from damage caused by high internal temperatures, and so forth. However, conventional techniques typically employ a reduction in power consumption to reduce the amount of heat generated by the device, which has a corresponding effect on an amount of functionality made available to a user of the device.

A spectrally selective radiation emission device is described. Heat may be transferred from computing devices by convection, conduction, and radiation. By employing a spectrally selective radiation emission device, the computing device may be configured to emit radiation at operating temperatures of components of the computing device (e.g., processors, display devices, power supplies, etc.) while still reflecting external radiation from other sources, such as sunlight. In this way, the spectral selectivity may be employed to protect the computing device from being heated by these external sources.

For example, the spectrally selective radiation emission device may be configured as a fabric, paint, and so on that is applied to a housing of a mobile computing device such as a tablet, wireless phone, and so on. Even though the spectrally selective radiation emission device may act as an insulator in relation to conduction and convection, the spectrally selective radiation emission device may also be configured to emit radiation when heated to an operational temperature of the computing device. This emission may thus counteract and even overcome the insulator effect thereby cooling an outer surface of the device. In this way, a fabric (or paint) may be employed as an outer surface yet still promote cooling of the device, e.g., by five degrees Celsius, than would otherwise be the case. Further discussion of these and other techniques may be found in relation to the following sections.

In the following discussion, an example environment is first described that may employ the techniques described herein. Example procedures are then described which may be performed in the example environment as well as other environments. Consequently, performance of the example procedures is not limited to the example environment and the example environment is not limited to performance of the example procedures.

Example Environment

Figure 1:
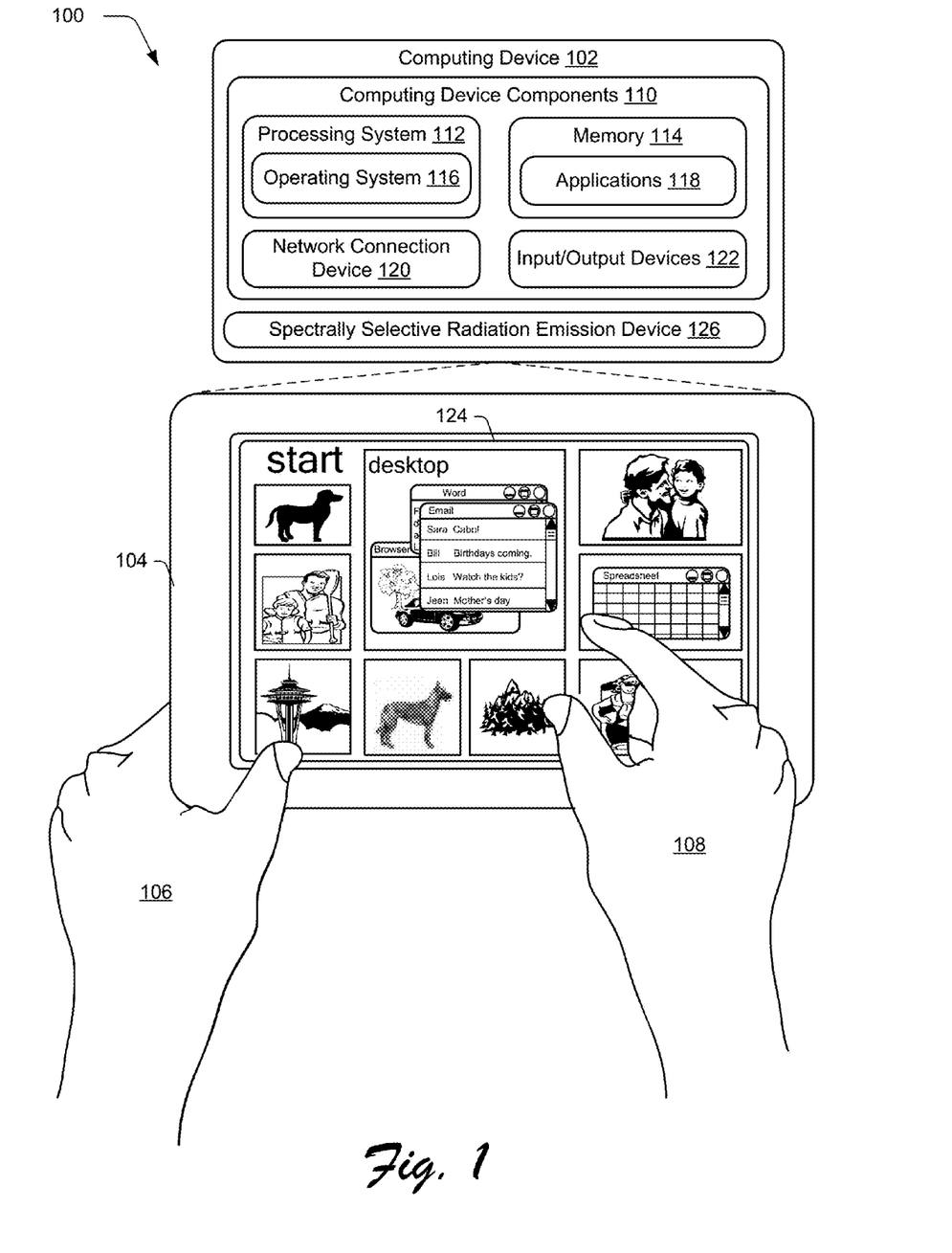
FIG. 1 is an illustration of an environment in an example implementation that is operable to employ spectrally selective radiation emission techniques described herein

FIG. 1 is an illustration of an environment 100 in an example implementation that is operable to employ techniques described herein. The illustrated environment 100 includes a computing device 102, which may be configured in a variety of ways.

The computing device 102, for example, may be configured as a mobile computing device as illustrated having a housing 104 (e.g., formed from a metal, plastic, composite, or other material) configured according to a handheld form factor, such as a tablet computer as illustrated, mobile phone, portable game or music device, and so on. As such, the housing 104 may be grasped by one or more hands 106, 108 of a user to support interaction in a mobile setting, e.g., to hold and interact with a user interface as illustrated.

The computing device 102 may also be configured in a variety of other ways, such as a desktop computer, an entertainment appliance, a set-top box communicatively coupled to a display device, a game console, one or more servers, and so forth. Thus, the computing device 102 may range from full resource devices with substantial memory and processor resources (e.g., personal computers, game consoles) to a low-resource device with limited memory and/or processing resources (e.g., traditional set-top boxes, hand-held game consoles). Further discussion of computing device 102 configurations may be found in relation to FIG. 9.

The computing device 102 is illustrated as including computing device components 110 that are disposed within the housing 104. Examples of computing device components 110 include a processing system 112 and memory 114 that are illustrated as executing an operating system 116 and storing applications 118 that are executable by the processing system 112, respectively. The computing device components 110 also include a network connection device 120 (e.g., to support wired and/or wireless communication), input/output devices 122 such as to support touchscreen functionality of a display device 124, and so forth.

During operation, the computing device components 110 may generate heat. As previously described, this heat may affect operation of the computing device 102, including an amount of functionality made available to a user of the computing device 102. Additionally, heat generation may be exacerbated for certain form factors, such as those employed by mobile computing devices that support limited airflow between components of the device.

Accordingly, the illustrated computing device 102 includes a spectrally selective radiation emission device 126. The spectrally selective radiation emission device 126 is configured to emit radiation, which may be used to remove heat generated by the computing device components 110 from the computing device 102. In this way, an internal space of the housing 104 and the computing device components 110 disposed therein may be cooled, thereby enabling the computing device 102 to provide full functionality to a user as desired, further discussion of which may be found in relation to the following figures.

Although a computing device 102 and computing device components 110 are described in this example, these techniques are applicable to any apparatus having electrical components or other components that generate heat during operation. This may include electronic devices such a display devices, peripheral devices, electrical charging devices, power supplies, and so forth.

Figure 2:
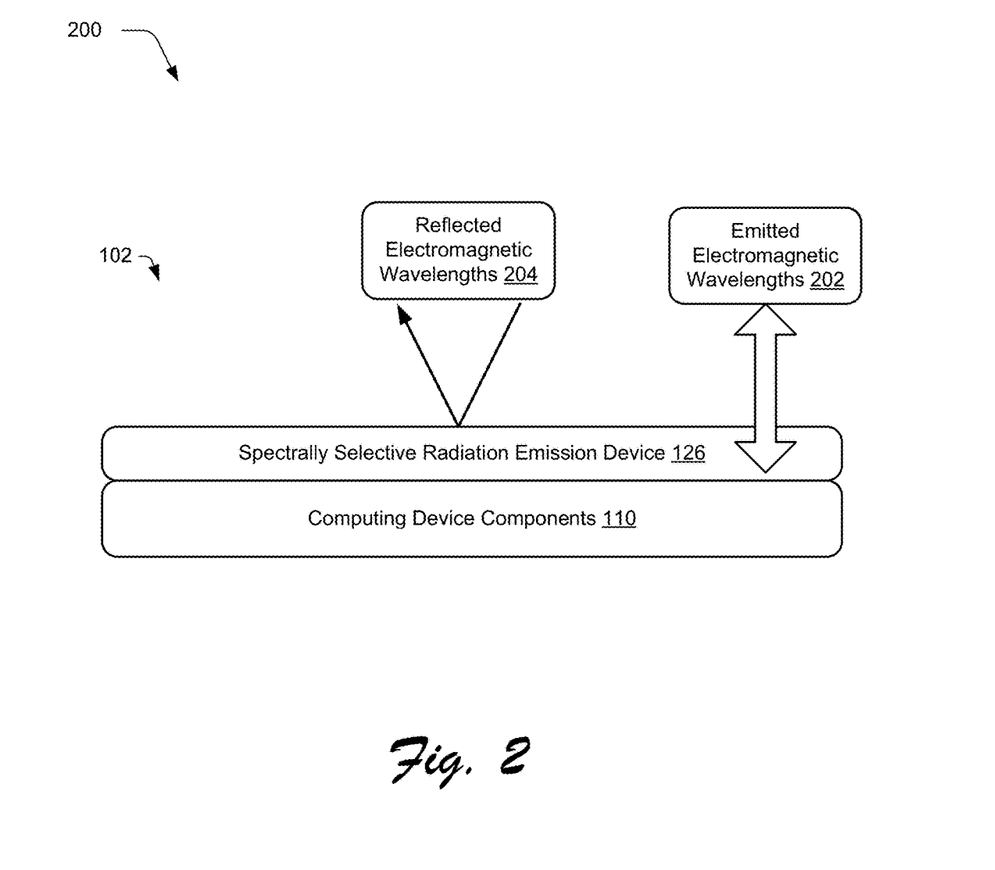
FIG. 2 depicts a system in an example implementation showing operation of a spectrally selective radiation emission device of FIG. 1 in greater detail.

FIG. 2 depicts a system 200 in an example implementation showing operation of the spectrally selective radiation emission device 126 of FIG. 1 in greater detail. As previously described, the computing device components 110 may generate heat during operation. Accordingly, the computing device components 110 may be configured to have a corresponding operating temperature that supports full functionality of the components. However, this heat may cause complications, such as to cause the computing device 102 to achieve a temperature that is not considered safe for a user of the computing device 102 (e.g., per IEC 60950) and even for the computing device components 110 themselves.

The spectrally selective radiation emission device 126, therefore, may be configured to emit electromagnetic wavelengths 202 when at the operating temperature associated with the computing device components 110. Thus, when the computing device components 110 reach the operating temperature, the corresponding heat may cause the spectrally selective radiation emission device 126 to emit particular electromagnetic wavelengths 202 (e.g., covering one or more ranges of wavelengths) and thus remove the heat from the computing device 102. This may cause a corresponding cooling of the computing device components 110 disposed within the housing 104 of the computing device 102.

A side effect of configuration to support emission at particular wavelengths is that the device is also configured to absorb energy at those particular wavelengths. Accordingly, the spectrally selective radiation emission device 126 is configured to be selective such that emission of electromagnetic wavelengths 202 that are caused at operating temperatures of the computing device components 110 is permitted but other electromagnetic wavelengths 204 are reflected.

In this way, the computing device 102 may be protected from heating that would otherwise be caused by these other wavelengths from external sources yet still support cooling performed by the emitted electromagnetic wavelengths. Thus, the spectrally selective radiation emission device 126 may overcome conventional limitations, such as for an approach in which all wavelengths of electromagnetic radiation are reflected (e.g., silver anodized aluminum) or an approach in which all wavelengths of electromagnetic radiation are absorbed, e.g., for black plastic. Further discussion of examples of configuration for selectively of wavelengths to address sunlight and other external sources may be found in relation to FIG. 4.

The spectrally selective radiation emission device 126 may also be configured to support a variety of functionality that is not available to the computing device 102 absent the emission functionality. For example, the spectrally selective radiation emission device 126 may be configured in a variety of ways, such as a coating (e.g., a paint) or even a fabric that may be secured to the housing 104 of the computing device 102 of FIG. 1. Conventionally, use of paints and fabrics could act as an insulator in relation to conduction of heat from a device, e.g., the use of a fabric may act as a blanket that traps heat to the device. However, through emission of electromagnetic wavelengths 202 this effect may be counteracted and even overcome, further discussion of which is described as follows and shown in a corresponding figure.

Figure 3:
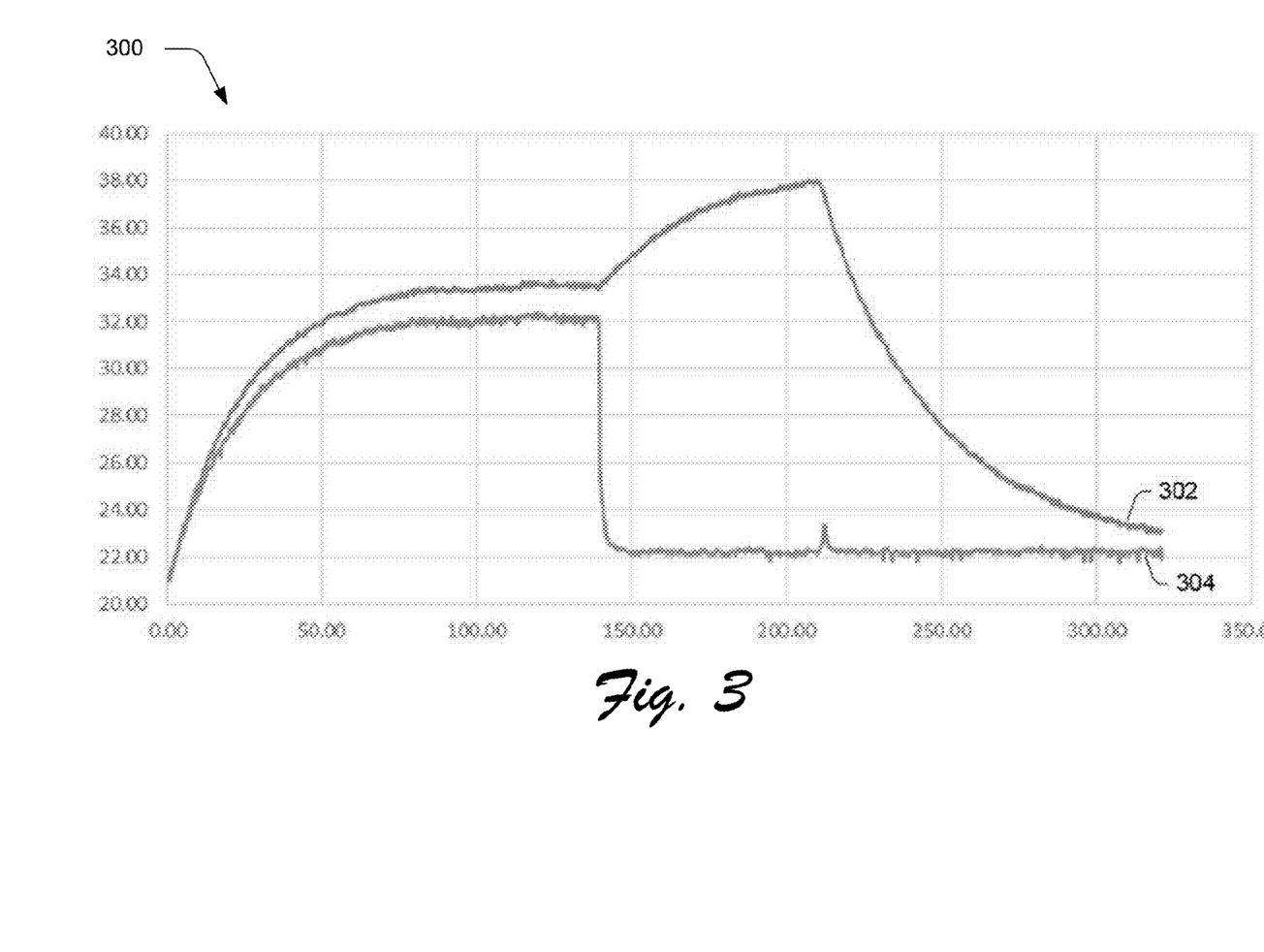
FIG. 3 depicts a graph showing use of a spectrally selective radiation emission device and then an effect of removal of the spectrally selective radiation emission device on temperature.

FIG. 3 depicts a graph 300 showing use of a spectrally selective radiation emission device 126 and then an effect of removal of the spectrally selective radiation emission device 126. The graph 300 includes an X-axis that defines temperature in degrees Celsius and a Y-axis that defines time in minutes.

An aluminum block is used in this example to represent a computing device and is wrapped in a thin polyurethane fabric and uniformly heated throughout to simulate operational temperature of computing device components 110. A first plot 302 defines temperature over time at a surface of the block and a second plot 304 defines temperature over time at a surface of the fabric.

The block was allowed to reach steady state at approximately 32 degrees Celsius on its outer surface (i.e., the fabric surface of plot 304) by using a heat input of 2.25 W, as shown at time period of approximately 60-140 seconds. The aluminum surface of the block is slightly warmer due to the insulation effect of the fabric as shown by plot 302 as previously described.

Next, the fabric was removed at approximately 140 minutes. After the fabric was removed, the temperature of the aluminum surface increased by approximately four to five degrees Celsius as shown by plot 302. Thus, even though the fabric insulates the aluminum conductively, it also provides a surface that is an excellent radiator in the range of a 32 degree Celsius blackbody thus enabling the block to lose significant heat via radiation. With this increase in radiation heat transfer, less of the 2.25 W is lost by convection and so the surface temperature is reduced, even to such a degree that the aluminum block temperature is reduced as well. At two hundred minutes the power to the heater was shut off and as should be apparent at 140 minutes the temperature of the fabric went back to room temperature as it was no being longer heated by the block.

Thus, in this example radiation emission by the spectrally selective radiation emission device 126 overcomes an effect of conductive and convective insulation of the device and thus may be used to cool the device as opposed to a bare surface of the device. As previously described this may support a variety of functionality, such as to permit securing of a fabric to the housing 104 of the computing device 102 to provide a desired tactile feel but still permit cooling of the computing device 102. Further, as illustrated an outer surface of the spectrally selective radiation emission device 126 may be lower than at a housing 104 and thus may further reduce an amount of heat that reaches a user of the device, e.g., at a hand 106 of a user holding the housing 104. Spectral selectivity of the spectrally selective radiation emission device 126 may be configured in a variety of different wavelengths to provide desired functionality, further discussion of which is described as follows and shown in a corresponding figure.

Figure 4:
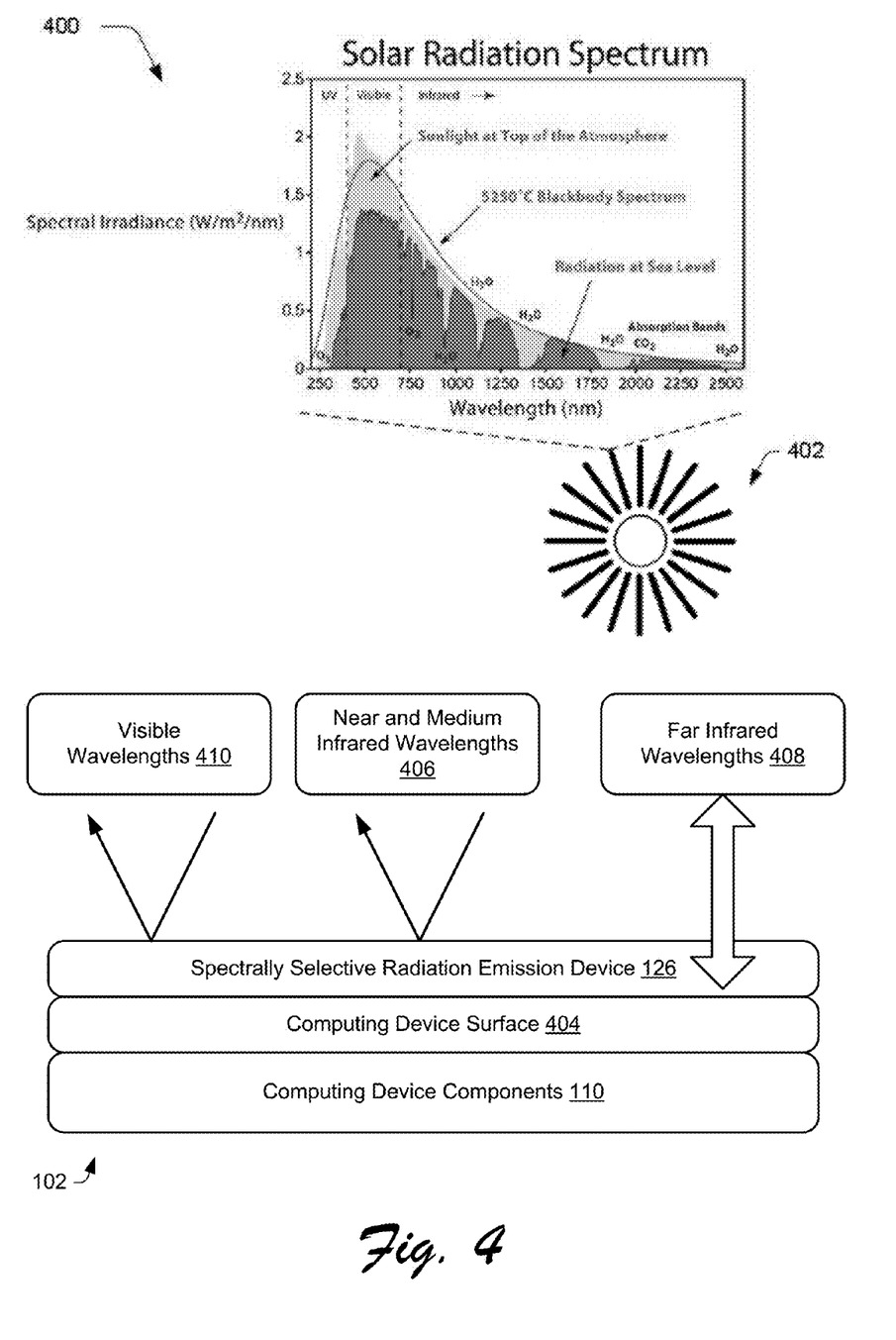
FIG. 4 depicts a system in an example implementation in which emission and reflection of a spectrally selective radiation emission device of FIG. 2 is configured to address sunlight.

FIG. 4 depicts a system 400 in an example implementation in which emission and reflection of the spectrally selective radiation emission device 126 is configured to address sunlight 402. In this example, the spectrally selective radiation emission device 126 is secured to a computing device surface 404 (e.g., the housing 104 of FIG. 1, display device 124, and so on), e.g., applied as a paint, through use of heat or adhesive to secure a fabric, and so on.

Sunlight 402 includes a variety of different wavelengths across the electromagnetic spectrum, a large portion of which is included in the infrared spectrum. For example, near and medium infrared wavelengths 406 (e.g., from approximately 0.75 to 2.5 micrometers for near to about 3-8 micrometers for medium) may include a majority of the sun's energy received by the computing device 102 from sunlight 402, e.g., over 37 percent. Far infrared wavelengths (e.g., from approximately 14 micrometers to one millimeter) may include eleven percent of the sun's energy received by the computing device 102 from sunlight 402. Most of this is absorbed by the atmosphere, however, thus allowing a material to be chosen for the spectrally selective radiation emission device 126 that emits/absorbs well at these wavelengths hence allowing the device to lose heat by radiation.

The spectrally selective radiation emission device 126 in this instance is configured to take this into account. As illustrated, the spectrally selective radiation emission device 126 may be configured to emit radiation at far infrared wavelengths 408 when the computing device components 110 have reached a steady-state operational temperature, e.g., approximately fifty degrees Celsius. Additionally, the spectrally selective radiation emission device 126 may be configured to reflect near and medium infrared wavelengths 406 of the sunlight 402.

Thus, the spectrally selective radiation emission device 126 may act to cool the computing device using far infrared wavelengths 408 for emission (e.g., approximately 10 k nm) yet resist heating caused by near infrared wavelengths 406 from the sunlight 402. The spectrally selective radiation emission device 126 may also be configured to reflect one or more visible wavelengths 410, e.g., to support a choice of color. In this way, the spectrally selective radiation emission device 126 may permit emission yet reduce potential absorption by being configured to emit and absorb using wavelengths that have reduced amounts of energy in comparison with other portions of the electromagnetic spectrum encountered by the computing device 102.

Although near and far infrared wavelengths were discussed by way of example, other ranges of electromagnetic radiation are also contemplated. This may include configuration of the spectrally selective radiation emission device 126 to permit or restrict short-wavelength infrared from 1.4-3 micrometers, mid-wavelength infrared from about 3-8 micrometers, long-wavelength infrared from about 8-15 micrometers, as well as other range of visible and non-visible (e.g., UV) light. The spectrally selective radiation emission device 126 may be configured for placement as part of a variety of external surfaces of the computing device 102, examples of which are described as follows and shown in corresponding figures.

Figure 5:
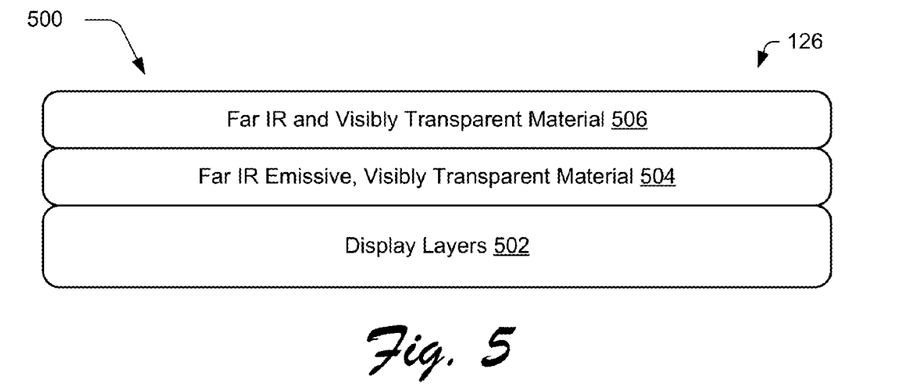
FIGS. 5-7 depict examples of implementation of the spectrally selective radiation emission device of FIG. 1 as part of a display device and as part of a housing of a computing device.
Figure 6:
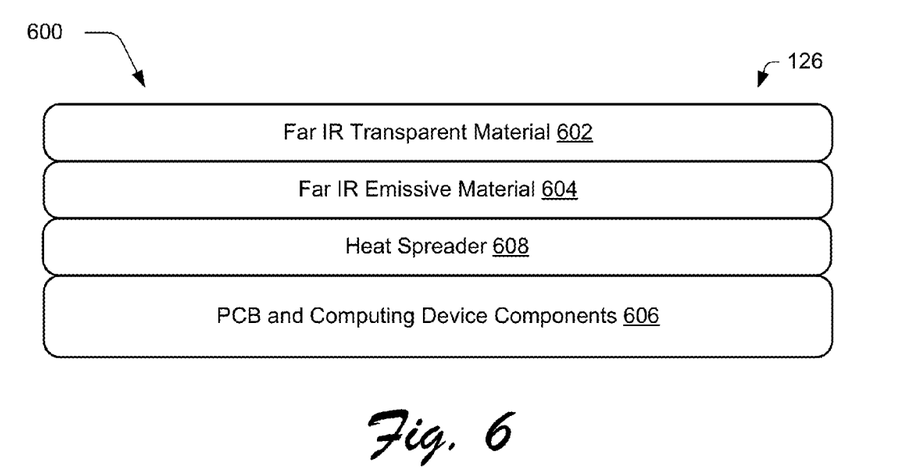
Figure 7:
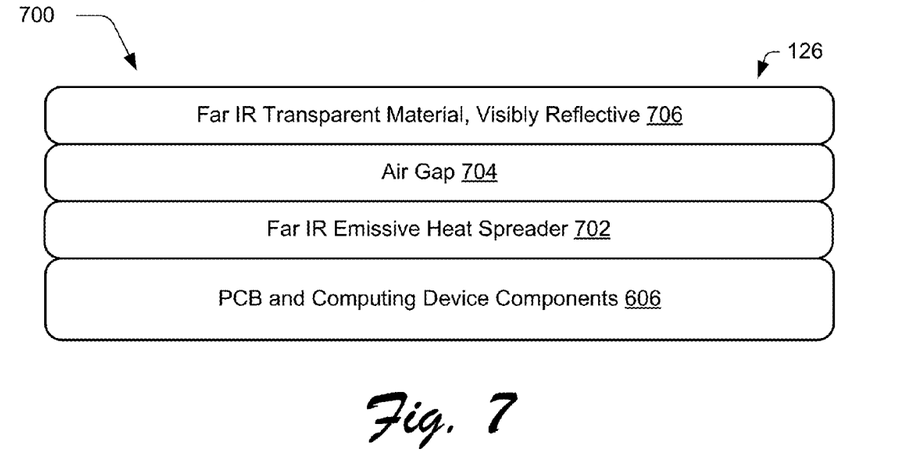

FIGS. 5-7 depict examples 500, 600, 700 of implementation of the spectrally selective radiation emission device 126 as part of a display device 124 and as part of the housing 104 of the computing device 102. In the example 500 of FIG. 5, the spectrally selective radiation emission device 126 is disposed over display layers 502 of the display device 124 of FIG. 1, e.g., a transparent substrate of the device. The spectrally selective radiation emission device 126 includes a layer formed from a far IR emissive and visibly transparent material 504 and thus may emit radiation as previously described yet permit viewing of an output of the display device 124. A far IR and visibly transparent material 506 is formed as a layer over the far IR emissive and visibly transparent material 504 to protect that layer. Thus, in this example heat generated by electronic components of the display device 124 may be emitted using the spectrally selective radiation emission device 126.

In the example 600 of FIG. 6, a far IR material transparent material 602 is formed as a layer over a far IR emissive material 604. Additionally, printed circuit board (PCB) and computing device components 606 are contacted by a heat spreader 608 to transfer heat to the spectrally selective radiation emission device 126. For example, the heat spreader 608 may be incorporated as part of the housing 104 of the computing device 102. In this way, the spectrally selective radiation emission device 126 may be configured to insulate a user from heat while allowing far IR radiation to pass through.

In the example 700 of FIG. 7, PCB and computing device components 606 are also illustrated. In this example, a far IR emissive heat spreader 702 is separated by an air gap 704 from a far IR transparent material that is visibly reflective 706, e.g., to provide a desired color. This permits high temperature electronic components to radiate to its surroundings and operate at a high temperature to maximize heat loss by radiation without burning a user.

As previously described, a variety of different materials may be used to form the spectrally selective radiation emission device 126, such as to apply as a paint, a fabric, and so on. For example, a spectrally selective coating may be applied to a flexible substrate, such as a polyester urethane material having embedded aluminum spheres under four microns in diameter, multiwall carbon nanotube with nickel oxide nano-composite coatings, and so on. A variety of other examples are also contemplated without departing from the spirit and scope thereof.

Example Procedures

The following discussion describes spectrally selective radiation emission techniques that may be implemented utilizing the previously described systems and devices. Aspects of each of the procedures may be implemented in hardware, firmware, or software, or a combination thereof. The procedures are shown as a set of blocks that specify operations performed by one or more devices and are not necessarily limited to the orders shown for performing the operations by the respective blocks. In portions of the following discussion, reference will be made to FIGS. 1-7.

Figure 8:
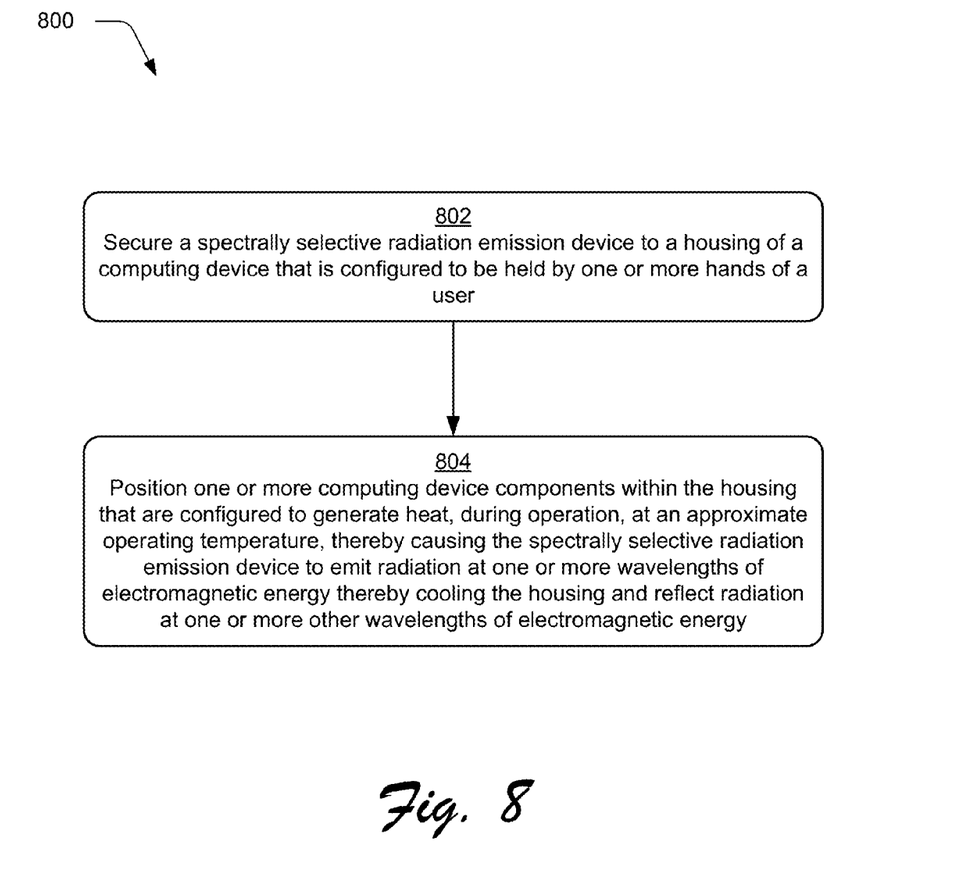
FIG. 8 is a flow diagram depicting a procedure in an example implementation in which a spectrally selective radiation emission device is assembled as part of a computing device.

FIG. 8 depicts a procedure 800 in an example implementation in which a computing device is configured to support spectrally selective radiation emission techniques. A spectrally selective radiation emission device is secured to a housing of a computing device that is configured to be held by one or more hands of a user (block 802). This may be performed in a variety of ways, such as applied as a coating, heat transfer, through use of an adhesive to secure a fabric, and so forth.

One or more computing device components are positioned within the housing that are configured to generate heat, during operation, at an approximate operating temperature, thereby causing the spectrally selective radiation emission device to emit radiation at one or more wavelengths of electromagnetic energy and thereby cooling the housing and reflect radiation at one or more other wavelengths of electromagnetic energy (block 804). The computing device components 110 may be configured in a variety of ways, such as a power supply, processing system 112, display device 124, or any other component that is configured to generate heat.

Example System and Device

Figure 9:
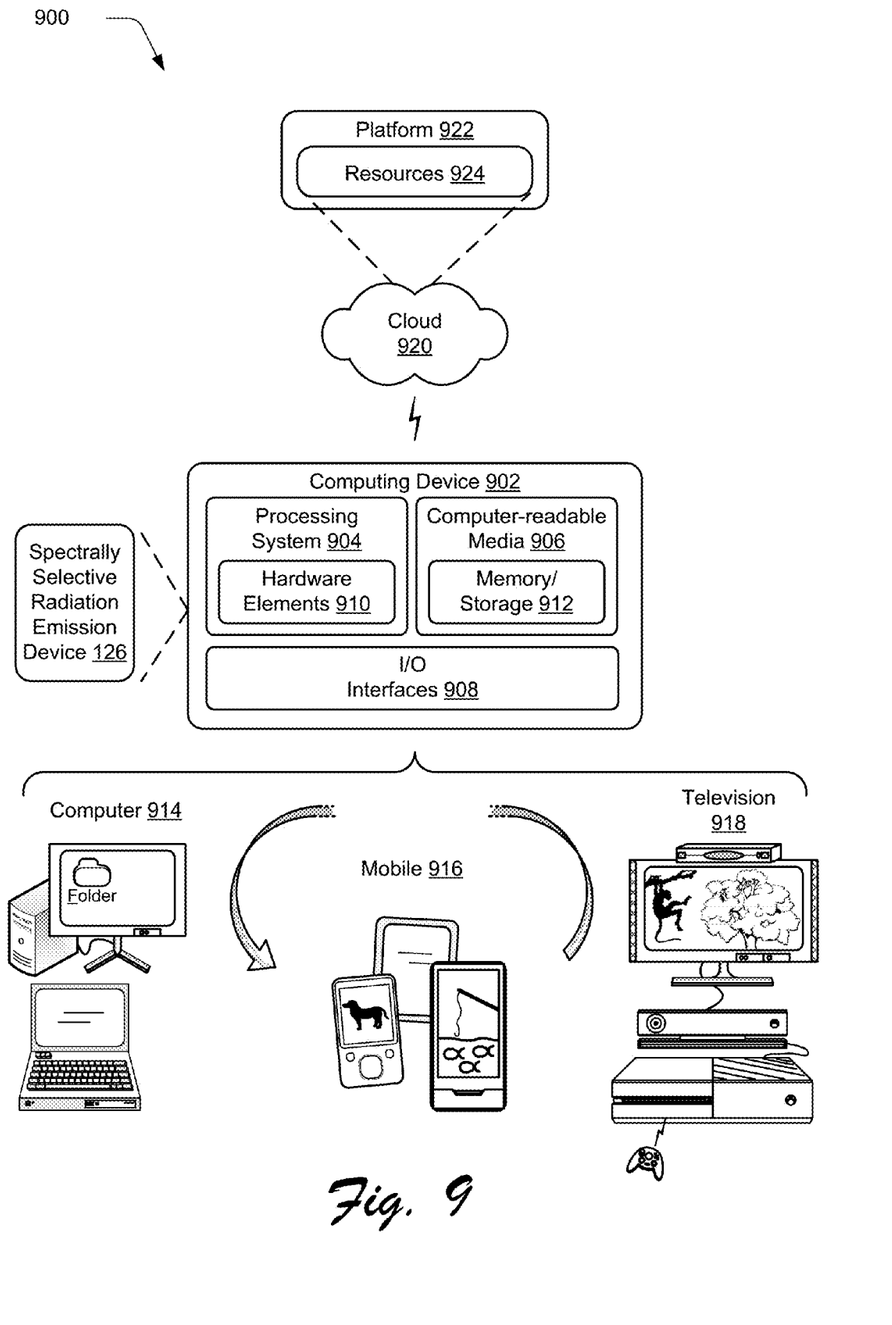
FIG. 9 illustrates an example system including various components of an example device that can be implemented as any type of computing device as described with reference to FIGS. 1-8 to implement embodiments of the techniques described herein.

FIG. 9 illustrates an example system generally at 900 that includes an example computing device 902 that is representative of one or more computing systems and/or devices that may implement the various techniques described herein. This is illustrated through inclusion of the spectrally selective radiation emission device 126. The computing device 902 may be, for example, a server of a service provider, a device associated with a client (e.g., a client device), an on-chip system, and/or any other suitable computing device or computing system.

The example computing device 902 as illustrated includes a processing system 904, one or more computer-readable media 906, and one or more I/O interface 908 that are communicatively coupled, one to another. Although not shown, the computing device 902 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 904 is representative of functionality to perform one or more operations using hardware. Accordingly, the processing system 904 is illustrated as including hardware element 910 that may be configured as processors, functional blocks, and so forth. This may include implementation in hardware as an application specific integrated circuit or other logic device formed using one or more semiconductors. The hardware elements 910 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable storage media 906 is illustrated as including memory/storage 912. The memory/storage 912 represents memory/storage capacity associated with one or more computer-readable media. The memory/storage component 912 may include volatile media (such as random access memory (RAM)) and/or nonvolatile media (such as read only memory (ROM), Flash memory, optical disks, magnetic disks, and so forth). The memory/storage component 912 may include fixed media (e.g., RAM, ROM, a fixed hard drive, and so on) as well as removable media (e.g., Flash memory, a removable hard drive, an optical disc, and so forth). The computer-readable media 906 may be configured in a variety of other ways as further described below.

Input/output interface(s) 908 are representative of functionality to allow a user to enter commands and information to computing device 902, and also allow information to be presented to the user and/or other components or devices using various input/output devices. Examples of input devices include a keyboard, a cursor control device (e.g., a mouse), a microphone, a scanner, touch functionality (e.g., capacitive or other sensors that are configured to detect physical touch), a camera (e.g., which may employ visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 902 may be configured in a variety of ways as further described below to support user interaction.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 902. By way of example, and not limitation, computer-readable media may include "computer-readable storage media" and "computer-readable signal media."

"Computer-readable storage media" may refer to media and/or devices that enable persistent and/or non-transitory storage of information in contrast to mere signal transmission, carrier waves, or signals per se. Thus, computer-readable storage media refers to non-signal bearing media. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" may refer to a signal-bearing medium that is configured to transmit instructions to the hardware of the computing device 902, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 910 and computer-readable media 906 are representative of modules, programmable device logic and/or fixed device logic implemented in a hardware form that may be employed in some embodiments to implement at least some aspects of the techniques described herein, such as to perform one or more instructions. Hardware may include components of an integrated circuit or on-chip system, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 910. The computing device 902 may be configured to implement particular instructions and/or functions corresponding to the software and/or hardware modules. Accordingly, implementation of a module that is executable by the computing device 902 as software may be achieved at least partially in hardware, e.g., through use of computer-readable storage media and/or hardware elements 910 of the processing system 904. The instructions and/or functions may be executable/operable by one or more articles of manufacture (for example, one or more computing devices 902 and/or processing systems 904) to implement techniques, modules, and examples described herein.

As further illustrated in FIG. 9, the example system 900 enables ubiquitous environments for a seamless user experience when running applications on a personal computer (PC), a television device, and/or a mobile device. Services and applications run substantially similar in all three environments for a common user experience when transitioning from one device to the next while utilizing an application, playing a video game, watching a video, and so on.

In the example system 900, multiple devices are interconnected through a central computing device. The central computing device may be local to the multiple devices or may be located remotely from the multiple devices. In one embodiment, the central computing device may be a cloud of one or more server computers that are connected to the multiple devices through a network, the Internet, or other data communication link.

In one embodiment, this interconnection architecture enables functionality to be delivered across multiple devices to provide a common and seamless experience to a user of the multiple devices. Each of the multiple devices may have different physical requirements and capabilities, and the central computing device uses a platform to enable the delivery of an experience to the device that is both tailored to the device and yet common to all devices. In one embodiment, a class of target devices is created and experiences are tailored to the generic class of devices. A class of devices may be defined by physical features, types of usage, or other common characteristics of the devices.

In various implementations, the computing device 902 may assume a variety of different configurations, such as for computer 914, mobile 916, and television 918 uses. Each of these configurations includes devices that may have generally different constructs and capabilities, and thus the computing device 902 may be configured according to one or more of the different device classes. For instance, the computing device 902 may be implemented as the computer 914 class of a device that includes a personal computer, desktop computer, a multi-screen computer, laptop computer, netbook, and so on.

The computing device 902 may also be implemented as the mobile 916 class of device that includes mobile devices, such as a mobile phone, portable music player, portable gaming device, a tablet computer, a multi-screen computer, and so on. The computing device 902 may also be implemented as the television 918 class of device that includes devices having or connected to generally larger screens in casual viewing environments. These devices include televisions, set-top boxes, gaming consoles, and so on.

The techniques described herein may be supported by these various configurations of the computing device 902 and are not limited to the specific examples of the techniques described herein. This functionality may also be implemented all or in part through use of a distributed system, such as over a "cloud" 920 via a platform 922 as described below.

The cloud 920 includes and/or is representative of a platform 922 for resources 924. The platform 922 abstracts underlying functionality of hardware (e.g., servers) and software resources of the cloud 920. The resources 924 may include applications and/or data that can be utilized while computer processing is executed on servers that are remote from the computing device 902. Resources 924 can also include services provided over the Internet and/or through a subscriber network, such as a cellular or Wi-Fi network.

The platform 922 may abstract resources and functions to connect the computing device 902 with other computing devices. The platform 922 may also serve to abstract scaling of resources to provide a corresponding level of scale to encountered demand for the resources 924 that are implemented via the platform 922. Accordingly, in an interconnected device embodiment, implementation of functionality described herein may be distributed throughout the system 900. For example, the functionality may be implemented in part on the computing device 902 as well as via the platform 922 that abstracts the functionality of the cloud 920.

CONCLUSION

Although the example implementations have been described in language specific to structural features and/or methodological acts, it is to be understood that the implementations defined in the appended claims is not necessarily limited to the specific features or acts described. Rather, the specific features and acts are disclosed as example forms of implementing the claimed features.

What is claimed is:

1. An apparatus comprising:
   a housing;
   a display disposed within the housing;
   one or more electrical components disposed within the housing; and
   a spectrally selective radiation emission device disposed on an exterior surface of the housing and the display, including:
     a first portion made from a first material disposed on the housing, the first material including a spectrally selective coating with metallic particles having a diameter smaller than 4 microns embedded therein, and configured to:
       emit radiation at one or more wavelengths of electromagnetic energy corresponding to a far infrared spectrum; and
       reflect radiation at other wavelengths of electromagnetic energy corresponding to a mid-infrared spectrum and a visible spectrum; and
     a second portion made from a second material disposed on the display and configured to be visually transparent and emit radiation away from the apparatus at one or more wavelengths of electromagnetic energy corresponding to the far infrared spectrum.

2. An apparatus as described in claim 1, wherein the spectrally selective radiation emission device is configured to reflect one or more wavelengths of electromagnetic energy that correspond to the near infrared spectrum.

3. An apparatus as described in claim 1, wherein the metallic particles of the first material of the first portion of the spectrally selective radiation emission device comprise aluminum particles.

4. An apparatus as described in claim 1, wherein the particles of the first material of the first portion of the spectrally selective radiation emission device further comprise carbon nanotubes.

5. An apparatus as described in claim 1, wherein the spectrally selective radiation emission device is configured to emit radiation responsive to the one or more electrical components generating heat during operation.

6. An apparatus as described in claim 1, wherein the apparatus is configured such that a surface temperature of the housing is higher than a surface temperature of the spectrally selective radiation emission device during operation of the one or more electrical components.

7. An apparatus as described in claim 1, wherein the spectrally selective radiation emission device comprises an outer layer of material that is transparent to the emitted radiation at the one or more wavelengths of electromagnetic energy corresponding to the far infrared spectrum.

8. A computing device comprising:
   a housing;
   a display disposed within the housing;
   one or more computing device components disposed within the housing;
   a first portion of a spectrally selective radiation emission device made from a first material, disposed on the housing, the first material including a spectrally selective coating with carbon nanotubes embedded therein, and configured to emit radiation at one or more wavelengths of electromagnetic energy corresponding to a far infrared spectrum, and reflect one or more other wavelengths of electromagnetic energy that correspond to a near infrared spectrum, and
   a second portion of the spectrally selective radiation emission device made from a second material, disposed on the display, and configured to be visually transparent and emit radiation at one or more wavelengths of electromagnetic energy corresponding to the far infrared spectrum.

9. A computing device as described in claim 8, wherein the spectrally selective radiation emission device is further configured to reflect one or more wavelengths of electromagnetic energy that correspond to a visible spectrum.

10. A computing device as described in claim 8, wherein the spectrally selective radiation emission device comprises an outer layer of material that is transparent to the emitted radiation at the one or more wavelengths of electromagnetic energy corresponding to the far infrared spectrum.

11. A computing device as described in claim 8, wherein the particles of the first material of the first portion of the spectrally selective radiation emission device further comprise metallic particles with a diameter under 4 microns.

12. A computing device as described in claim 11, wherein the metallic particles of the first material of the first portion of the spectrally selective radiation emission device are aluminum.

13. A computing device as described in claim 8, wherein the spectrally selective radiation emission device is configured to emit radiation thereby cooling the one or more computing device components during operation of the computing device.

14. A computing device as described in claim 8, wherein the computing device is configured such that a surface temperature of the housing is higher than a surface temperature of the spectrally selective radiation emission device during operation of the one or more computing device components.

15. A housing for an apparatus, comprising:
a spectrally selective radiation emission device attached to the housing and including:
a first portion made from a first material, the first material including a spectrally selective coating with aluminum particles having a diameter under 4 microns embedded therein, configured as:
a far infrared emissive material configured to emit radiation at one or more wavelengths of electromagnetic energy corresponding to a far infrared spectrum; and
a near infrared reflective material configured to reflect radiation at one or more other wavelengths of electromagnetic energy corresponding to a near infrared spectrum; and
a second portion made from a second, visually transparent material configured as a far infrared reflective material configured to reflect radiation at one or more wavelengths of electromagnetic energy corresponding to the far infrared spectrum.

16. A housing as described in claim 15, wherein the particles of the first material of the first portion of the spectrally selective radiation emission device further comprise carbon nanotubes.

17. A housing as described in claim 16, wherein the carbon nanotubes include a nickel-oxide coating.

18. A housing as described in claim 15, wherein the housing is for one or more of a display device, a peripheral device, an electrical charging device, or a power supply.

19. A housing as described in claim 15, further comprising one or more electrical components disposed within the housing.

20. A housing as described in claim 15, further comprising one or more electrical components disposed within the housing, wherein the spectrally selective radiation emission device is configured such that a surface temperature of the housing is higher than a surface temperature of the spectrally selective radiation emission device during operation of the one or more electrical components.

* * * * *